United States Patent
Ping et al.

(10) Patent No.: US 10,809,780 B2
(45) Date of Patent: Oct. 20, 2020

(54) ACTIVE DISTURBANCE REJECTION BASED THERMAL CONTROL

(71) Applicant: Samsung Electronics Co., Ltd., Suwon-si, Gyeonggi-do (KR)

(72) Inventors: Zhan Ping, Milpitas, CA (US); Qinling Zheng, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 15/961,782

(22) Filed: Apr. 24, 2018

(65) Prior Publication Data

US 2018/0260008 A1    Sep. 13, 2018

Related U.S. Application Data

(63) Continuation-in-part of application No. 15/659,538, filed on Jul. 25, 2017.

(60) Provisional application No. 62/470,828, filed on Mar. 13, 2017, provisional application No. 62/618,039, filed on Jan. 16, 2018.

(51) Int. Cl.
*G06F 1/20* (2006.01)
*G05D 23/19* (2006.01)
*G05B 13/02* (2006.01)
*G06F 1/3234* (2019.01)
(Continued)

(52) U.S. Cl.
CPC ............ *G06F 1/206* (2013.01); *G05B 13/024* (2013.01); *G05D 23/1919* (2013.01); *G05D 23/1934* (2013.01); *G06F 1/3275* (2013.01); *G06F 3/0616* (2013.01); *G06F 3/0625* (2013.01); *G06F 3/0629* (2013.01); *G06F 3/0679* (2013.01); *H05K 7/20836* (2013.01)

(58) Field of Classification Search
CPC ............................ G06F 1/206; G06F 11/3058
See application file for complete search history.

(56) References Cited

U.S. PATENT DOCUMENTS

| 5,307,477 A | 4/1994 | Taylor et al. |
| 5,461,699 A | 10/1995 | Arbabi et al. |

(Continued)

FOREIGN PATENT DOCUMENTS

| CN | 103092229 B | 4/2015 |
| CN | 103643027 B | 8/2015 |

(Continued)

OTHER PUBLICATIONS

Jingqing Han; From PD to Active Disturbance Rejection Control, Mar. 3, 2009, IEEE, p. 900-906 (Year: 2009).*

(Continued)

*Primary Examiner* — Kidest Bahta
(74) *Attorney, Agent, or Firm* — Lewis Roca Rothgerber Christie LLP

(57) ABSTRACT

A system and method for active disturbance rejection based thermal control is configured to receive, at a first active disturbance rejection thermal control (ADRC) controller, a first temperature measurement from a first thermal zone. The ADRC controller generates a first output control signal for controlling a first cooling element, wherein the first output control signal is generated according a first estimated temperature and a first estimated disturbance calculated by a first extended state observer (ESO) of the first ADRC controller.

20 Claims, 5 Drawing Sheets

(51) Int. Cl.
*G06F 3/06* (2006.01)
*H05K 7/20* (2006.01)

(56) References Cited

U.S. PATENT DOCUMENTS

| | | |
|---|---|---|
| 5,560,816 A | 10/1996 | Robinson |
| 5,574,827 A | 11/1996 | Wang |
| 6,021,076 A | 2/2000 | Woo et al. |
| 7,587,572 B1 | 9/2009 | Stenstrom |
| 8,060,340 B2 | 11/2011 | Gao et al. |
| 8,341,380 B2 | 12/2012 | Deming et al. |
| 8,392,928 B1 | 3/2013 | Forys et al. |
| 8,590,332 B2 | 11/2013 | Wyatt |
| 8,644,963 B2 | 2/2014 | Gao et al. |
| 9,313,929 B1 | 4/2016 | Malone et al. |
| 9,342,443 B2 | 5/2016 | Walker et al. |
| 9,355,024 B2 | 5/2016 | Nguyen et al. |
| 9,430,328 B2 | 8/2016 | Conte et al. |
| 9,709,965 B2 | 7/2017 | Slessman et al. |
| 10,250,673 B1 | 4/2019 | Brooker et al. |
| 2004/0093315 A1 | 5/2004 | Carney |
| 2010/0085196 A1* | 4/2010 | Stiver .............. H05K 7/20836 340/584 |
| 2010/0259998 A1 | 10/2010 | Kwon et al. |
| 2011/0054714 A1 | 3/2011 | Santos et al. |
| 2011/0279967 A1* | 11/2011 | Claassen ............ H05K 7/20736 361/679.46 |
| 2012/0023492 A1 | 1/2012 | Govindan et al. |
| 2012/0095719 A1 | 4/2012 | Araki et al. |
| 2012/0218707 A1 | 8/2012 | Chan |
| 2012/0283850 A1* | 11/2012 | Gao .................... G05B 5/01 700/45 |
| 2012/0283881 A1 | 11/2012 | Federspiel |
| 2013/0030785 A1 | 1/2013 | Satterfield et al. |
| 2013/0080680 A1 | 3/2013 | Chu |
| 2013/0138876 A1 | 5/2013 | Wang |
| 2013/0290972 A1 | 10/2013 | Cherkasova et al. |
| 2014/0101371 A1 | 4/2014 | Nguyen et al. |
| 2014/0195013 A1* | 7/2014 | Gao .................... G05B 5/01 700/45 |
| 2014/0201477 A1 | 7/2014 | Greenfield et al. |
| 2014/0201741 A1 | 7/2014 | Govindan et al. |
| 2015/0205714 A1 | 7/2015 | Greenfield et al. |
| 2015/0277762 A1 | 10/2015 | Guo et al. |
| 2015/0324135 A1 | 11/2015 | Chan et al. |
| 2016/0033944 A1 | 2/2016 | El-Shaer et al. |
| 2016/0086654 A1 | 3/2016 | Arora et al. |
| 2016/0209816 A1 | 7/2016 | Neundorfer |
| 2016/0224381 A1 | 8/2016 | Farhan et al. |
| 2016/0259575 A1 | 9/2016 | Hikimura et al. |

FOREIGN PATENT DOCUMENTS

| | | |
|---|---|---|
| CN | 106292273 A | 1/2017 |
| CN | 106444419 A | 2/2017 |
| KR | 10-1775454 | 9/2017 |

OTHER PUBLICATIONS

Huang Yi, Active Disturbance Rejection Control, 2014.7.30, Chinese control conference, p. 1-96. (Year: 2014).*

Wu et al., "Exploiting Heat-Accelerated Flash Memory Wear-Out Recovery to Enable Self-Healing SSDs," HotStorage, 2011, 5 pages, Internet URL: http://static.usenix.org/legacy/events/hotstorage11/tech/final_files/Wu.pdf.

Office action issued in U.S. Appl. No. 15/659,538 by the USPTO, dated Nov. 29, 2018, 13 pages.

Final Office action issued in U.S. Appl. No. 15/659,538 by the USPTO, dated May 9, 2019, 12 pages.

Office action issued in U.S. Appl. No. 15/659,538 by the USPTO, dated Sep. 17, 2019, 11 pages.

* cited by examiner

US 10,809,780 B2

ACTIVE DISTURBANCE REJECTION BASED THERMAL CONTROL

CROSS-REFERENCE TO RELATED APPLICATIONS

The present application is a continuation-in-part (CIP) of U.S. patent application Ser. No. 15/659,538, filed on Jul. 25, 2017, which claims priority to U.S. Provisional Patent Application No. 62/470,828, filed on Mar. 13, 2017, the content of which are incorporated herein by reference in their entirety. The present application also claims priority to, and the benefit of, U.S. Provisional Patent Application No. 62/618,039, filed on Jan. 16, 2018, the contents of which are incorporated herein by reference in its entirety.

BACKGROUND

Some embodiments of the present disclosure relate generally to regulating thermal cooling in servers and datacenters.

The rapid growth in data has driven a corresponding growth in datacenters. As part of datacenter growth, computing infrastructure density has also increased. For example, 1U storage servers have grown in popularity and feature increasingly powerful processors and higher density storage (e.g. flash storage). Providing the appropriate cooling for these higher density datacenters has become increasingly difficult and the cost of providing cooling has become an increasingly large component of the datacenter's total power consumption.

The above information is only for enhancement of understanding of the background of embodiments of the present disclosure, and therefore may contain information that does not form the prior art.

SUMMARY

Some embodiments of the present disclosure provide a system and method for active disturbance rejection thermal control. In various embodiments, the system receives, at a first active disturbance rejection thermal control (ADRC) controller, a first temperature measurement from a first thermal zone. The system may generate, using the first ADRC controller, a first output control signal for controlling a first cooling element. In various embodiments, the first output control signal is generated according an estimated temperature for the first zone and an estimated disturbance calculated by a first extended state observer (ESO) of the first ADRC controller.

In various embodiments, the system receives at a second ADRC controller, a second temperature measurement from a second thermal zone. The second ADRC controller may generate a second output control signal for controlling a second cooling element. In various embodiments, the second output control signal is generated according a second estimated temperature and a second estimated disturbance calculated by a second ESO of the second ADRC controller.

In various embodiments, the system calculates a first temperature tracking error, at the first ADRC controller, by comparing the first temperature measurement to a first target temperature and calculates a second temperature tracking error, at the second ADRC controller, by comparing the second temperature measurement to a second target temperature. In various embodiments, the system may modify at least one of the first output control signal or the second output control signal based on the first and second temperature tracking errors.

In various embodiments, the first thermal zone includes at least one of a SSD, a processor, or a graphics processing unit.

In various embodiments, the ESO is a second order ESO that operates according to a max temperature reading from the first thermal zone, an estimation of the max temperature reading from the first thermal zone, an estimation of total disturbance, the first output control signal, an observer gain, and at least one tunable parameter.

In various embodiments, the observer gain is inversely proportional to the values of a tunable observer bandwidth and sampling time.

In various embodiments, the first output control signal (ui) is a function of a first target temperature (r) in the first zone, the first estimated temperature (z1) for the first zone, and the first estimated disturbance (z2) defined as:

$$u_i = \frac{1}{b_0}[\omega_c(|r-z_1|^{0.5})\text{sign}(r-z_1) - z_2]$$

where $\omega_c$ is a tunable controller bandwidth and $b_0$ is a tunable parameter.

In various embodiments, a storage server includes a first device in a first thermal zone, the first thermal zone having a first temperature sensor and a first cooling element. The storage server also includes a first active disturbance rejection thermal control (ADRC) controller coupled to the first temperature sensor and the first cooling element. In various embodiments, the first ADRC controller is configured to receive a first temperature of the first thermal zone from the first temperature sensor and provide a first output control signal to the first cooling element according a first estimated temperature, a first estimated disturbance calculated by a first extended state observer (ESO), and a first target temperature.

In various embodiments, the storage server also includes a second device in a second thermal zone, the second thermal area having a second temperature sensor and a second cooling element. In various embodiments, a second ADRC controller is coupled to the second temperature sensor and the second cooling element. In various embodiments, the ADRC controller is configured to receive a second temperature measurement from the second temperature sensor and generate a second output control signal for controlling the second cooling element, wherein the second output control signal is generated according a second estimated temperature and a second estimated disturbance calculated by a second ESO, and a second target temperature.

In various embodiments, the first ADRC is further configured to calculate a first temperature tracking error by comparing the first temperature measurement to the first target temperature and the second ADRC is further configured calculate a second temperature tracking error by comparing the second temperature measurement to the second target temperature. In various embodiments, at least one of the first output control signal or the second output control signal is modified based on the first and second temperature tracking errors.

In various embodiments, the first device comprises at least one of a SSD, a processor, or a graphics processing unit.

In various embodiments, the ESO is a second order ESO that operates according to on a max temperature reading from the first thermal zone, an estimation of the max temperature reading from the first thermal zone, an estimation of total disturbance, the first output control signal, an observer gain, and at least one tunable parameter.

In various embodiments, the observer gain is inversely proportional to the values of a tunable observer bandwidth and sampling time.

In various embodiments, the first output control signal (ui) comprises a function of a target temperature (r) in the first zone, the first estimated temperature (z1) for the first zone, and the first estimated disturbance (z2) defined as:

$$u_i = \frac{1}{b_0}[\omega_c(|r - z_1|^{0.5})\text{sign}(r - z_1) - z_2]$$

where $\omega c$ is a tunable controller bandwidth and b0 is a tunable parameter.

In various embodiments, a datacenter includes multiple thermal zones having ADRC. In various embodiments, the data center includes a first thermal zone having a first temperature sensor and a first cooling element and a first active disturbance rejection thermal control (ADRC) controller coupled to the first temperature sensor and the first cooling element. In various embodiments, the first ADRC controller is configured to receive a first temperature of the first thermal zone from the first temperature sensor and provide a first output control signal to the first cooling element according a first estimated temperature, a first estimated disturbance calculated by a first extended state observer (ESO), and a first target temperature. In various embodiments the datacenter includes a second thermal zone having a second temperature sensor and a second cooling element and a second ADRC controller coupled to the second temperature sensor and the second cooling element. In various embodiments, the second ADRC controller is configured to receive a second temperature measurement from the second temperature sensor and generate a second output control signal for controlling the second cooling element, wherein the second output control signal is generated according a second estimated temperature and a second estimated disturbance calculated by a second ESO, and a second target temperature.

In various embodiments, the first ADRC is further configured to calculate a first temperature tracking error by comparing the first temperature measurement to the first target temperature and the second ADRC is further configured calculate a second temperature tracking error by comparing the second temperature measurement to the second target temperature. In various embodiments, at least one of the first output control signal or the second output control signal is modified based on the first and second temperature tracking errors.

In various embodiments, the first thermal zone comprises at least one server and the second thermal zone comprises at least one server.

In various embodiments, the first thermal zone comprises at least a portion of the second thermal zone.

In various embodiments, the ESO comprises a second order ESO that operates according to on a max temperature reading from the first thermal zone, an estimation of the max temperature reading from the first thermal zone, an estimation of total disturbance, the first output control signal, an observer gain, and at least one tunable parameter.

In various embodiments, the observer gain is inversely proportional to the values of a tunable observer bandwidth and sampling time.

BRIEF DESCRIPTION OF THE DRAWINGS

Some embodiments can be understood in more detail from the following description taken in conjunction with the accompanying drawings, in which.

DETAILED DESCRIPTION

Figure 1:
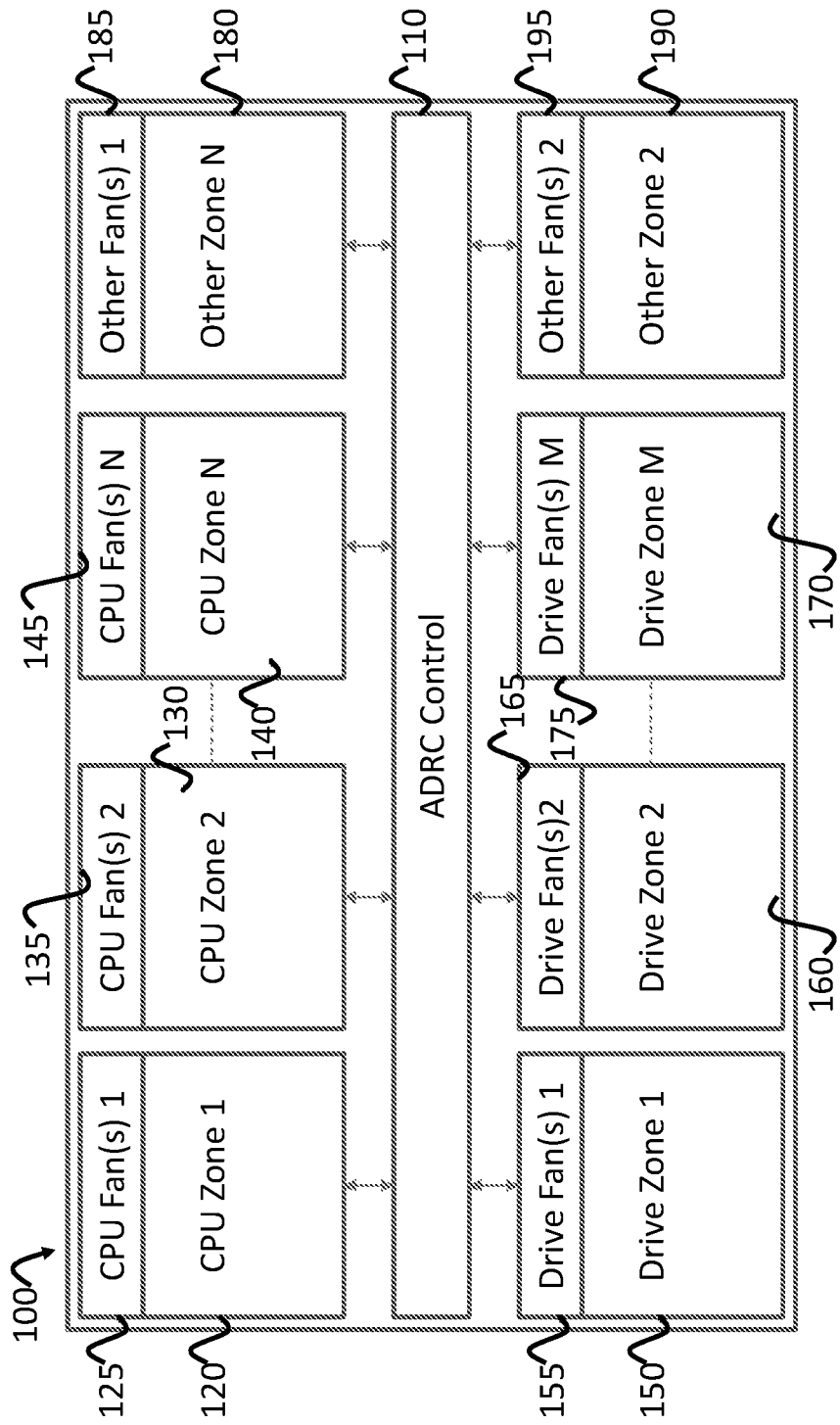
FIG. 1 depicts an example server using ADRC thermal management according to various embodiments of the present invention.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments of the present invention include a system and method for active disturbance rejection-based thermal control. In various embodiments, the system includes one or more controllers configured to monitor and control the cooling of one or more drive zones and processor zones. The system is configured for active disturbance rejection control (ADRC)-based thermal management to improve thermal control in datacenters, servers, and storage systems. The system improves thermal control efficiency by allowing the system to compensate for workload fluctuations in addition to thermal readings. The improved thermal control therefore reduces cooling costs and thereby decreases total cost of ownership for the servers and datacenters. Furthermore, the system also increases performance by reducing thermal throttling of processors, GPUs, and storage drives.

In the related art, a number of thermal management systems are employed. For example, some systems include native cooling (e.g. a default server fan speed control), dynamic cooling (e.g. dynamic fan speed control based on temperature), and proportional-integral-derivative (PID) control. PID controllers calculate the difference between a target value and the current value and applies a correction based on the proportional, integral, and derivative terms. Although each of these methods each have various advantages, each also comes with a number of disadvantages. For example, PID controllers require a good balance among the three controller gains and may compromise the transient response, robustness, or disturbance rejection ability.

FIG. 1 depicts an example server using ADRC thermal management according to various embodiments of the present invention.

Referring to FIG. 1, in various embodiments, a server 100 may include an ADRC controller 110 for managing the cooling of multiple thermal (e.g. temperature) zones. For example, in various embodiments, the server 100 may be 1U storage sever including multiple processors, storage drives, and other components such as memory (e.g. DRAM), GPUs, power supplies, and other components. In various embodiments, the server 100 may be divided into multiple thermal zones that each includes various components. In some embodiments, each of the thermal zones may primarily include a single type of component (e.g. processors or storage drives), while in other embodiments, the thermal zones may include a mixture of components. In some embodiments, the temperature zones may be physically divided, while in other embodiments, there may not be any physical barriers between zones. In various embodiments, each temperature zone may include one or more active cooling elements. For example, each zone may include one or more fans. In some embodiments, the cooling elements may be associated with one or more thermal zones.

In various embodiments, the ADRC controller 110 may have multiple inputs and multiple outputs (MIMO) for receiving temperature measurements and controlling cooling elements. For example, in various embodiments, the ADRC controller 110 includes a temperature input for each device (e.g. a processor, GPU, or storage drive) in each of the zones and has control outputs for each of the corresponding cooling elements.

In various embodiments, the server 100 may include one or more processor zones 120, 130, 140, one or more drive zones 150, 160, 170, and one or more other zones 180, 190. In various embodiments, each of the processor zones 120, 130, 140 may include one or more CPUs. In various embodiments, each of the drive zones 150, 160, 170 include one or more storage drives (e.g. SSDs, HDDs, etc.). In various embodiments, the other zones 180, 190 include one or more other computing components such as power supplies, GPUs, memory, or any other server components. In various embodiments, each of the zones includes one or more cooling elements 125, 135, 145, 155, 165, 175, 185, 195. For example, each of the cooling elements may include one or more adjustable speed fans.

Figure 2:
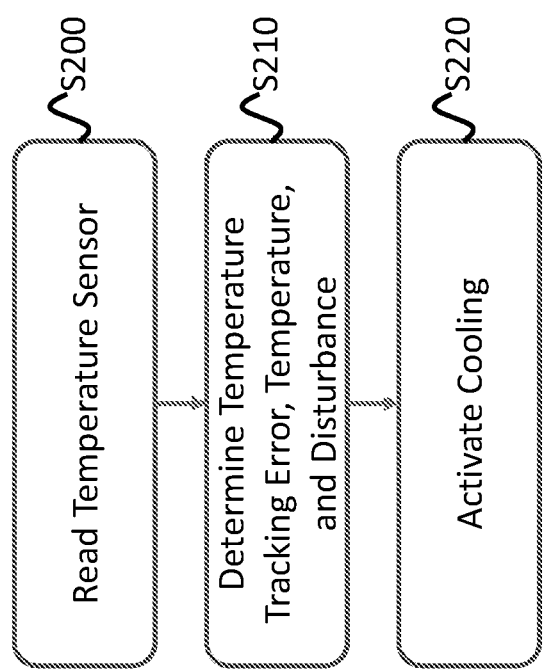
FIG. 2 depicts a method of performing ADRC-based thermal control for a thermal zone according to various embodiments of the present invention.

FIG. 2 depicts a method of performing ADRC-based thermal control for a thermal zone according to various embodiments of the present invention.

Referring to FIG. 2, the ADRC controller (e.g. the ADRC controller 110 from FIG. 1) may be configured to monitor multiple temperature zones in a server (e.g. the server 100 from FIG. 1). In various embodiments, each of the temperature zones may include a separate ADRC control loop for monitoring the temperature, estimating disturbances, and providing an output for managing the cooling elements (e.g. controlling fan speeds). For example, for a server may include i thermal zones. In various embodiments, the ADRC controller receives one or more temperature measurements from one or more temperature sensors in the $i^{th}$ thermal zone (S200). In various embodiments, the temperature sensors may include temperature sensors embedded in devices (e.g. a temperature sensor in each SSD, processor, GPU etc.), while in other embodiments, the temperature sensor may be for a zone including multiple devices (e.g. located in the server chassis). In various embodiments, the ADRC controller may use the temperature reading to determine the temperature tracking error (e.g. the difference between the set temperature and the estimated max temperature), and to calculate the estimated temperature and the estimated disturbance (S210), which will be discussed in detail below. Based on the temperature tracking error, estimated temperature, and estimated disturbance, the ADRC controller may provide an output control signal to the cooling element(s) to control the output of the cooling element(s) (e.g. adjust the fan speed) (S220).

In various embodiments, the ADRC controller is a MIMO system that is a combination of multiple single-input-single-output (SISO) or MIMO systems. In various embodiments, the ADRC controller may include a plurality of ADRC controllers. For example, in various embodiments, there may be a separate ADRC controller for each thermal zone. Thus, each thermal zone may have a separate ADRC control loop that includes an extended state observer (ESO) for estimating the real time temperature in the thermal zone along with the external disturbances (e.g. workloads) impacting the thermal zone. For example, the external disturbances may include the lumped uncertainties originated from an unknown workload sent to the devices operating in the thermal zone (e.g. I/O sent to a storage drive, workloads sent to a processor, etc.). In various embodiments, the ESO may be a second order ESO defined according to Equations 1-5 as follows:

$$e = z_1 - y_i \tag{1}$$

$$fe = fal(e, 0.5, \delta), \; fe_1 = fal(e, 0.25, \delta) \tag{2}$$

$$fal(e, \alpha, \delta) = \begin{cases} \dfrac{e}{\delta^{1-\alpha}}, & |e| \leq \delta \\ |e|^\alpha \operatorname{sign}(e), & |e| \geq \delta \end{cases} \tag{3}$$

$$\dot{z}_1 = z_2 - l_1 fe + b_0 u_i \tag{4}$$

$$\dot{z}_2 = -l_2 fe_1 \tag{5}$$

Where $y_i$ is the temperature reading from the zone (e.g. the highest temperature reading from a SSD in a zone containing multiple SSDs), $z_1$ is the estimation of the max temperature reading from the zone, $z_2$ is an estimation of the total disturbance to the loop, and $u_i$ is the output control signal for controlling the cooling elements. $l_1$ and $l_2$ represent the observer gain. The values for $\delta$, $b_0$, and $\alpha$ are tunable parameters that may be selected based on overall system tuning.

Equations 4 and 5 may be rewritten to show the output control signal as a function of the ESO outputs. For example, the ESO equations 4 and 5 may be converted to a linear form as shown in equation 4:

$$\begin{bmatrix} \dot{z}_1 \\ \dot{z}_2 \end{bmatrix} = \begin{bmatrix} -l_1 & 1 \\ -l_2 & 0 \end{bmatrix} \begin{bmatrix} z_1 \\ z_2 \end{bmatrix} + \begin{bmatrix} b_0 & l_1 \\ 0 & l_2 \end{bmatrix} \begin{bmatrix} u_i \\ y_i \end{bmatrix} \tag{6}$$

Using the zero order hold method, the discrete-time form of the ESO is described by equation 7:

$$\begin{bmatrix} z_1(k) \\ z_2(k) \end{bmatrix} = \begin{bmatrix} -l_1 T_s + 1 & T_s \\ -l_2 T_s & 1 \end{bmatrix} \begin{bmatrix} z_1(k-1) \\ z_2(k-1) \end{bmatrix} + \begin{bmatrix} b_0 T_s & l_1 T_s \\ 0 & l_2 T_s \end{bmatrix} \begin{bmatrix} u_i(k-1) \\ y_i(k-1) \end{bmatrix} \tag{7}$$

Where Ts is the sampling time.

In various embodiments, the observer gain (β) should be selected to locate all (e.g. four) of the poles of Equation 7 such that:

$$[l_1, l_2]^T = \left[1 - \beta^2, \frac{(1-\beta)^2}{T_s}\right]^T \quad (8)$$

Where β is defined by Equation 9:

$$\beta = e^{-\omega_0 T_s} \quad (9)$$

In equation 9, $\omega_0$ is a tunable observer bandwidth. Thus, may be the observer gain (β) may, in various embodiments, be the single tuning parameter for the ESO. With a well-tuned ESO, the observer states will close track the state of the system. Thus, the output control signal ($u_i$) may be represented by Equation 10:

$$u_i = \frac{1}{b_0}[\omega_c(|r - z_1|^{0.5})\text{sign}(r - z_1) - z_2] \quad (10)$$

Where r is a temperature set point (e.g. a target or desired operating temperature) and $\omega_c$ is a tunable controller bandwidth and $b_0$ is a tunable parameter set by a user. Thus, the ESO estimates the maximum temperature and the workload disturbance and the ADRC is able to actively compensate for the workload disturbance.

Figure 3:
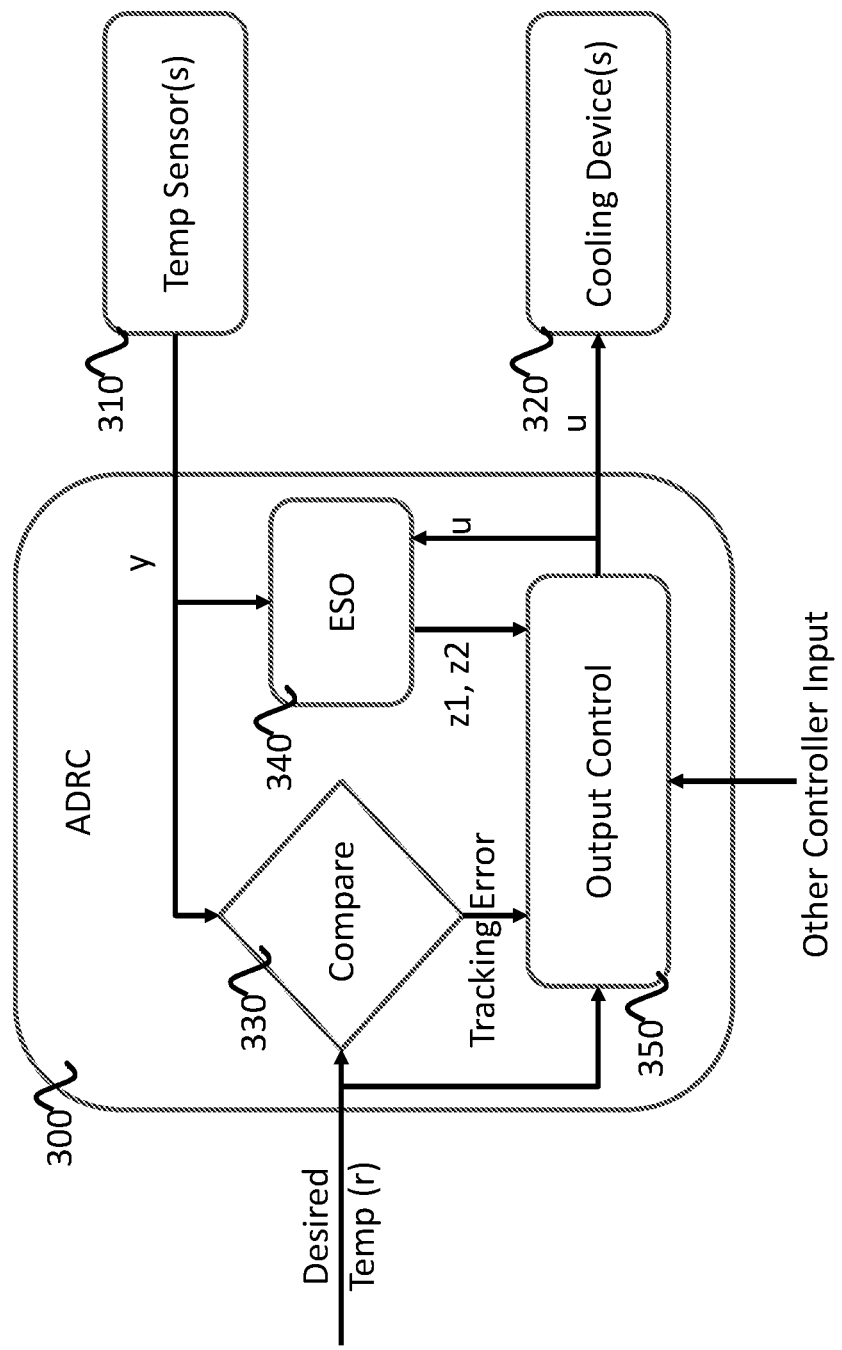
FIG. 3 depicts an example ADRC controller according to various embodiments of the present invention.

FIG. 3 depicts an example ADRC controller according to various embodiments of the present invention.

Referring to FIG. 3, in various embodiments, the ADRC controller 300 may be configured to receive temperature information from one or more temperature sensor 310 and control the output of one or more cooling elements 320 for a thermal zone. The thermal zone may have various sizes. For example, in various embodiments, one or more SSDs may be operating in thermal zone inside of a storage server, while in various other embodiments, the thermal zone may include one or more servers operating inside of a datacenter. It should be understood that the various embodiments may be scaled up and down and include multiple levels of ADRC controllers (e.g. ADRC-based control for cooling within a server and ADRC-based control for cooling within a datacenter).

In various embodiments, the ADRC controller 300 receives a target temperature (r). The target temperature may be a beneficial operating temperature for one or more devices operating within the thermal zone. For example, in various embodiments, the thermal zone may include multiple SSDs and the target operating temperature may be 60 degrees Celsius. In various embodiments, the ADRC controller 300 also receives a zone temperature (y) from the temperature sensor(s) 310. In various embodiments, the zone temperature (y) may include the highest temperature reading from the thermal zone. In other embodiments, the zone temperature (y) may include an average temperature reading from the temperature sensors in the thermal zone.

In various embodiments, the ADRC includes a comparison 330 for comparing the zone temperature with the target temperature to generate a temperature tracking error. In various embodiments, the zone temperature (y) is also provided to the ESO 340 for generating the estimation of the max temperature reading from the zone ($z_1$) and the estimation of the total disturbance to the loop ($z_2$) in accordance with Equations 1-5. In various embodiments, the ADRC controller 300 includes an output controller 350 for providing output to the cooling elements (s) 320. In various embodiments, embodiments, the output controller 350 receives the tracking error, target temperature (r) and the output of the ESO 340 ($z_1$, $z_2$) and generates the output control signal ($u_i$) (e.g. according to equation 10). The output control signal ($u_i$) may also be fed back to the ESO 340 for further calculations (e.g. for calculating estimated max temperature $z_1$ as show in Equation 4).

In various embodiments, the ADRC controller 300 may also receive input from other ADRC controllers. For example, in various embodiments, the cooling elements may be shared across thermal zones or all of the cooling elements may not be able to be activated at the same time. In various embodiments, one or more other ADRC controllers 300 may provide their tracking error for comparison and the cooling elements for the zone with the highest tracking error may be activated as will be discussed with reference to FIGS. 4 and 5.

Figure 4:
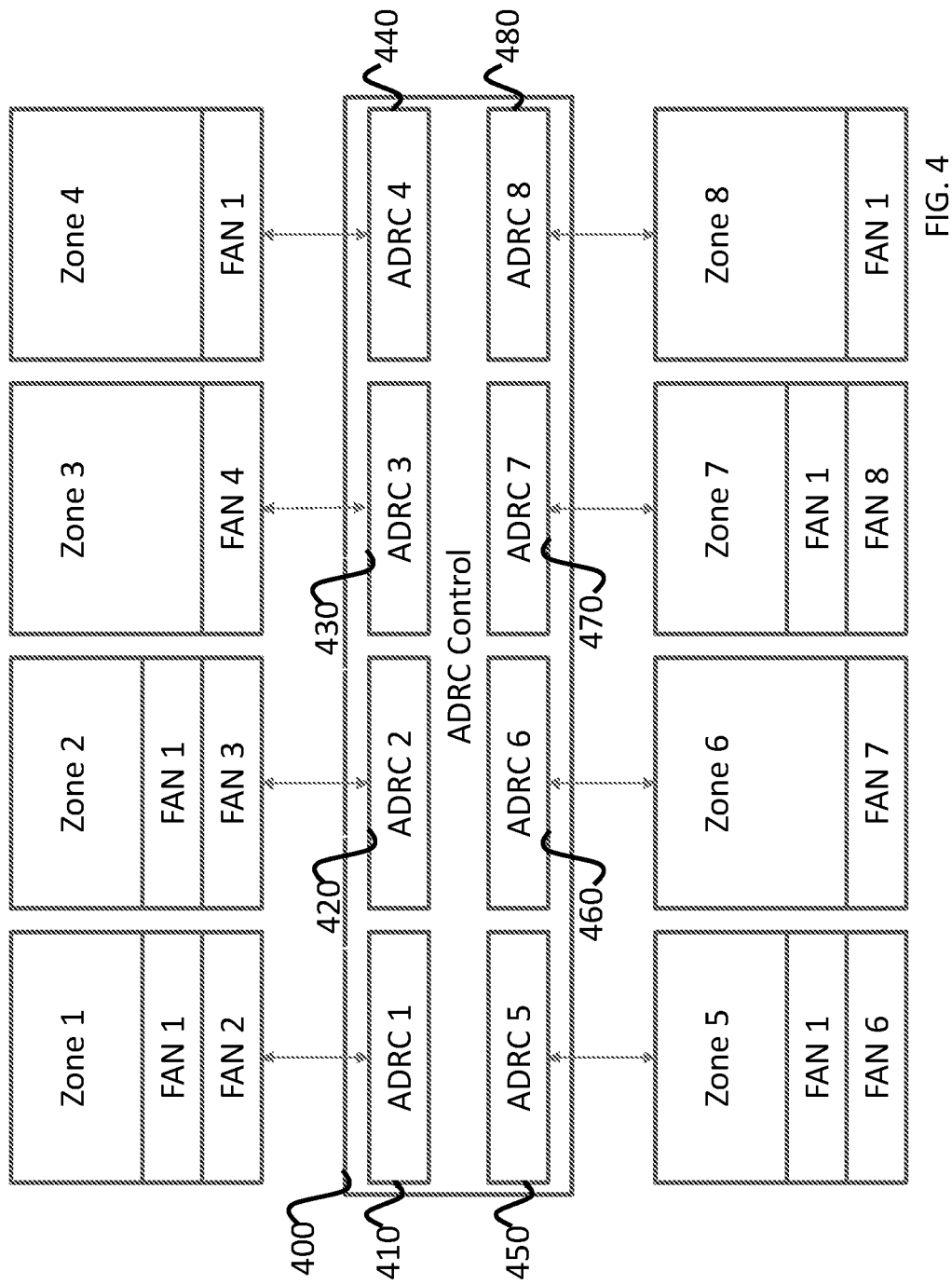
FIG. 4 depicts an example ADRC controller that includes a plurality of ADRC controllers for a plurality of thermal zones according to various embodiments of the present invention.

FIG. 4 depicts an example ADRC controller that includes a plurality of ADRC controllers for a plurality of thermal zones according to various embodiments of the present invention.

Referring to FIG. 4, in various embodiments, the ADRC Controller 400 is configured to manage the cooling for thermal zones 1 through 8 (Zone 1-8). For example, in various embodiments, the ADRC controller 400 is a MIMO system that is a combination of multiple single-input-single-output (SISO) or MIMO systems and includes a separate ADRC controllers 410-480 for each of the thermal zones. For example, in various embodiments, a first ADRC controller 410 may be configured to monitor a first thermal zone (Zone 1) and control the cooling elements (FAN 1, FAN 2), a second ADRC controller 420 may be configured to monitor a second thermal zone (Zone 2) and control the cooling elements (FAN 1, FAN 3), a third ADRC controller 430 may be configured to monitor a third thermal zone (Zone 3) and control the cooling elements (FAN 4), a fourth ADRC controller 440 may be configured to monitor for a forth thermal zone (Zone 4) and control the cooling elements (FAN 1), a fifth ADRC controller 450 may be configured to monitor for a fifth thermal zone (Zone 5) and control the cooling elements (FAN 1, FAN 6), a sixth ADRC controller 460 may be configured to monitor and for a sixth thermal zone (Zone 6) and control the cooling elements (FAN 7), a seventh ADRC controller 470 may be configured to monitor a seventh thermal zone (Zone 7) and control the cooling elements (FAN 1, FAN 8), and an eighth ADRC controller 480 may be configured to monitor for an eighth thermal zone (Zone 8) and control the cooling elements (FAN 1).

Figure 5:
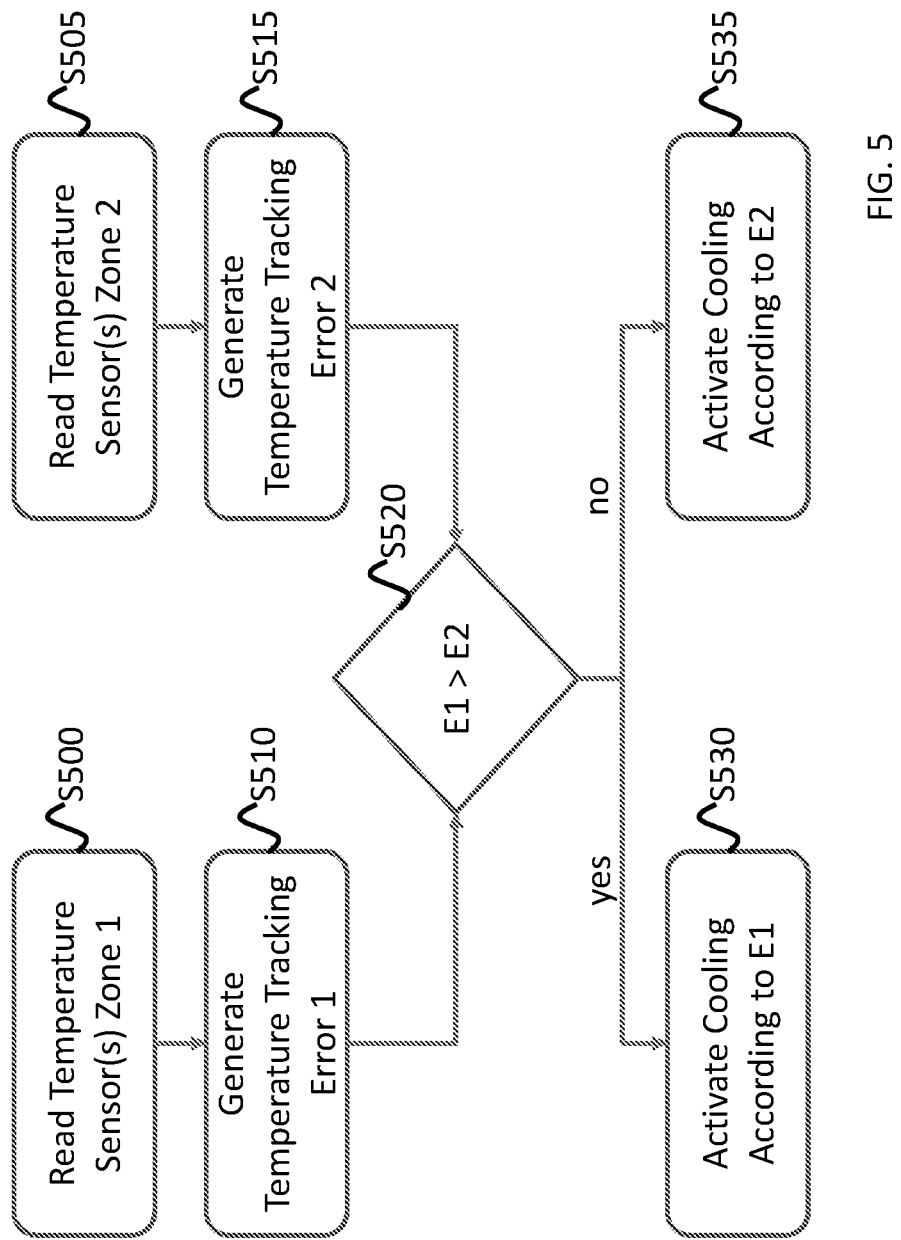
FIG. 5 depicts a method of controlling the cooling elements for multiple thermal zones according to various embodiments of the present invention.

FIG. 5 depicts a method of controlling the cooling elements for multiple thermal zones according to various embodiments of the present invention.

Referring to FIG. 5, and with continued reference to FIG. 4, in various embodiments, the ADRC controller 400 is configured receive temperature measurements from multiple thermal zones and activate one or more cooling elements. For example, in various embodiments, a first ADRC controller 410 may receive temperature sensor readings from a first thermal zone (Zone 1) (S400). Concurrently, a second ADRC controller 420 may receive temperature sensor readings from a second thermal zone (Zone 2) (S405). In various embodiments, the first and second ADRC controllers 410, 420 may generate a first and second temperature tracking error (S510, S515). In various embodiments, the ADRC 400 may not be able to activate both the cooling elements for the first thermal zone (Zone 1) and second thermal zone (Zone 2) concurrently. For example, the first thermal zone (Zone 1) and second thermal zone (Zone 2) may share a cooling element (e.g. FAN 1), or it may not be possible to activate the cooling elements for both zones due to some restriction (e.g. a power restriction). For example, in a server, the first thermal zone (Zone 1) may include one or more processors, second thermal zone (Zone 2) may include one or more SSDs, and FAN 1 may be a server chassis fan, FAN 2 may be a CPU fan, and FAN 3 may be a SSD fan. Thus, when controlling the first and second thermal zones, FAN 1 can only be controlled by one ADRC controller. Thus, in various embodiments, the ADRC may compare the first and second tracking errors (S520). In various embodiments, when the first tracking error is greater than the second tracking error, the first ADRC activates the cooling elements according to the temperature readings in the first thermal zone. Conversely, when the first tracking error is less than the second tracking error, the second ADRC activates the cooling elements according to the temperature readings in the second thermal zone.

Accordingly, the above described embodiments of the present disclosure provide a system and method for an active disturbance rejection based thermal control. The ADRC-based system is able to improve fan power consumption efficiency and better regulate component temperature while avoiding downgraded device performance (e.g. due to device throttling) caused by workload fluctuations. For example, in various embodiments, the ADRC-based system is more capable of regulating component temperature when compared to conventional systems (e.g. native cooling, dynamic cooling, and PID-based cooling). For example, the ADRC-based thermal control system is more robust to ambient temperature than PID-based systems. The ADRC-based system is more robust to fast changes and/or unknown workloads than native, dynamic, and PID-based systems. The ADRC-based system is more robust to changes in CPU utilization rates than native and PID-based systems. The ADRC-based system is better able to minimize temperature overshoot and undershoot than native, dynamic, and PID-based systems. Furthermore, the ADRC-based system is better able to avoid device throttling when compared to dynamic and PID-based systems. These features allow for the ADRC-based system to provide for higher component performance than conventional systems.

In various embodiments, the ADRC-based thermal control system is also able to improve fan power control efficiency. For example, unlike native and dynamic systems, the ADRC-based system provides a continuously changeable control signal. Similarly, the ADRC-based system is also temperature tracking error correctable, while native and dynamic-based systems are not. The ADRC-based system is also capable of more efficient power consumption and has a low control effort compared to the native and dynamic systems. The ADRC-based system also allows for a smoother control effort when compared to the dynamic and PID-based systems, which leads to less wear and tear on the fans and thereby increases the fans' life expectancy.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of active disturbance rejection thermal control (ADRC) comprising:
   receiving, at a first ADRC controller, a first temperature measurement from a first thermal zone; and
   generating, by the first ADRC controller, a first output control signal for controlling a first cooling element, wherein the first output control signal is generated according a first estimated temperature for the first thermal zone and a first estimated disturbance for the first thermal zone calculated by a first extended state observer (ESO) of the first ADRC controller based on the first temperature measurement.

2. The method of claim 1, further comprising:
   receiving, at a second ADRC controller, a second temperature measurement from a second thermal zone; and
   generating, by the second ADRC controller, a second output control signal for controlling a second cooling element, wherein the second output control signal is generated according a second estimated temperature for the second thermal zone and a second estimated disturbance for the second thermal zone calculated by a second ESO of the second ADRC controller.

3. The method of claim 2, further comprising:
   calculating a first temperature tracking error, at the first ADRC controller, by comparing the first temperature measurement to a first target temperature;
   calculating a second temperature tracking error, at the second ADRC controller, by comparing the second temperature measurement to a second target temperature;
   modifying at least one of the first output control signal or the second output control signal based on the first and second temperature tracking errors.

4. The method of claim 1, wherein the first thermal zone comprises at least one of a solid state drive (SSD), a processor, or a graphics processing unit.

5. The method of claim 1, wherein the first ESO comprises a second order ESO that operates according to a max temperature reading from the first thermal zone, an estimation of the max temperature reading from the first thermal zone, an estimation of total disturbance, the first output control signal, an observer gain, and at least one tunable parameter.

6. The method of claim 5, wherein the observer gain is inversely proportional to values of a tunable observer bandwidth and sampling time.

7. The method of claim 1, wherein the first output control signal ($u_i$) is based, at least in part, on a first target temperature ($r$) for the first thermal zone, the first estimated temperature ($z_1$), the first estimated disturbance ($z_2$), a tunable controller bandwidth ($\omega_c$), and a tunable parameter ($b_0$).

8. A storage server comprising:
   a first device in a first thermal zone, the first thermal zone comprising a first temperature sensor and a first cooling element;

a first active disturbance rejection thermal control (ADRC) controller coupled to the first temperature sensor and the first cooling element, wherein the first ADRC controller is configured to:
receive a first temperature of the first thermal zone from the first temperature sensor; and
provide a first output control signal to the first cooling element according a first estimated temperature for the first thermal zone, a first estimated disturbance calculated by a first extended state observer (ESO) for the first thermal zone, and a first target temperature for the first thermal zone.

9. The storage server of claim 8, further comprising:
a second device in a second thermal zone, the second thermal zone comprising a second temperature sensor and a second cooling element;
a second ADRC controller coupled to the second temperature sensor and the second cooling element, wherein the second ADRC controller is configured to:
receive a second temperature measurement from the second temperature sensor; and
generate a second output control signal for controlling the second cooling element, wherein the second output control signal is generated according a second estimated temperature in the second thermal zone and a second estimated disturbance calculated by a second ESO for the second thermal zone, and a second target temperature for the second thermal zone.

10. The storage server of claim 9, wherein:
the first ADRC controller is further configured to calculate a first temperature tracking error by comparing the first temperature to the first target temperature; and
the second ADRC controller is further configured calculate a second temperature tracking error by comparing the second temperature measurement to the second target temperature;
wherein at least one of the first output control signal or the second output control signal is modified based on the first and second temperature tracking errors.

11. The storage server of claim 8, wherein the first device comprises at least one of a SSD, a processor, or a graphics processing unit.

12. The storage server of claim 8, wherein the first ESO comprises a second order ESO that operates according to a max temperature reading from the first thermal zone, an estimation of the max temperature reading from the first thermal zone, an estimation of total disturbance, the first output control signal, an observer gain, and at least one tunable parameter.

13. The storage server of claim 12, wherein the observer gain is inversely proportional to values of a tunable observer bandwidth and sampling time.

14. The storage server of claim 8, wherein the first output control signal ($u_i$) comprises a function of a target temperature ($r$), the first estimated temperature ($z_1$), and the first estimated disturbance ($z_2$) defined as:

$$u_i = \frac{1}{b_0}[\omega_c(|r - z_1|^{0.5})\text{sign}(r - z_1) - z_2]$$

where $\omega_c$ is a tunable controller bandwidth and $b_0$ is a tunable parameter.

15. A datacenter comprising:
a first thermal zone comprising a first temperature sensor and a first cooling element;
a first active disturbance rejection thermal control (ADRC) controller coupled to the first temperature sensor and the first cooling element, wherein the first ADRC controller is configured to:
receive a first temperature of the first thermal zone from the first temperature sensor; and
provide a first output control signal to the first cooling element according a first estimated temperature, a first estimated disturbance calculated by a first extended state observer (ESO), and a first target temperature;
a second thermal zone comprising a second temperature sensor and a second cooling element;
a second ADRC controller coupled to the second temperature sensor and the second cooling element, wherein the second ADRC controller is configured to:
receive a second temperature measurement from the second temperature sensor; and
generate a second output control signal for controlling the second cooling element, wherein the second output control signal is generated according a second estimated temperature and a second estimated disturbance calculated by a second ESO, and a second target temperature.

16. The datacenter of claim 15, wherein:
the first ADRC controller is further configured to calculate a first temperature tracking error by comparing the first temperature to the first target temperature; and
the second ADRC controller is further configured calculate a second temperature tracking error by comparing the second temperature measurement to the second target temperature;
wherein at least one of the first output control signal or the second output control signal is modified based on the first and second temperature tracking errors.

17. The datacenter of claim 15, wherein the first thermal zone comprises at least one server and the second thermal zone comprises at least one server.

18. The datacenter of claim 15, wherein the first thermal zone comprises at least a portion of the second thermal zone.

19. The datacenter of claim 15, wherein the first ESO comprises a second order ESO that operates according to a max temperature reading from the first thermal zone, an estimation of the max temperature reading from the first thermal zone, an estimation of total disturbance, the first output control signal, an observer gain, and at least one tunable parameter.

20. The datacenter of claim 19, wherein the observer gain is inversely proportional to values of a tunable observer bandwidth and sampling time.

* * * * *